US 6,620,701 B2

(12) United States Patent
Ning

(10) Patent No.: US 6,620,701 B2
(45) Date of Patent: Sep. 16, 2003

(54) METHOD OF FABRICATING A METAL-INSULATOR-METAL (MIM) CAPACITOR

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 131 days.

(21) Appl. No.: 09/977,004

(22) Filed: Oct. 12, 2001

(65) Prior Publication Data

US 2003/0073282 A1 Apr. 17, 2003

(51) Int. Cl.$^7$ ............................................ H01L 21/20
(52) U.S. Cl. ................................................. 438/396
(58) Field of Search ................... 438/244, 250, 438/253, 387, 393, 396, 381; 257/306, 301, 27.048, 27.092

(56) References Cited

U.S. PATENT DOCUMENTS

| | | | |
|---|---|---|---|
| 4,792,834 A | * 12/1988 | Uchida | 257/304 |
| 5,410,503 A | * 4/1995 | Anzai | 365/149 |
| 5,654,581 A | 8/1997 | Radosevich et al. | |
| 6,251,740 B1 | * 6/2001 | Johnson et al. | 438/381 |
| 6,410,955 B1 | * 6/2002 | Baker et al. | 257/307 |
| 6,451,667 B1 | * 9/2002 | Ning | 438/397 |
| 6,475,855 B1 | * 11/2002 | Fishburn | 438/239 |
| 6,486,529 B2 | * 11/2002 | Chi et al. | 257/531 |
| 2002/0081814 A1 | * 6/2002 | Ning | 438/386 |

OTHER PUBLICATIONS

Kar-Roy, et al., "High Density Metal Insulator Metal Capacitors Using PECVD Nitride for Mixed Signal and RF Circuits", Proc., 1999, pp. IITC 99–245—99–247.
Liu, et al., "Single Mask Metal-Insulator-Metal (MIM) Capacitor with Copper Damascene Metallization for Sub-0.18 μm Mixed Mode Signal and System-on-a-Chip (SoC) Applications", Proc., 2000, pp. 111–113.
Armacost, et al., "A High Reliability Metal Insulator Metal Capacitor for 0.18 μm Copper Technology", Digest, 2000, IEDM.

* cited by examiner

Primary Examiner—Olik Chaudhuri
Assistant Examiner—Brook Kebede
(74) Attorney, Agent, or Firm—Slater & Matsil, L.L.P.

(57) ABSTRACT

A method of manufacturing a metal-insulator-metal capacitor (MIMCap) (36) including first conductive lines (15), capacitor dielectric (26) and second conductive lines (28), the MIMCap (36) including horizontal capacitive portions (32) and vertical capacitive portions (34). The method includes forming first conductive lines (15) in a first insulating layer (14) of a wafer (10), depositing a second insulating layer (22), depositing a resist, removing portions of the resist, removing exposed portions of the second insulating layer (22) and portions of the first insulating layer (14), removing the remaining resist, and then depositing a capacitor dielectric (26) and second conductive lines (28).

22 Claims, 2 Drawing Sheets

METHOD OF FABRICATING A METAL-INSULATOR-METAL (MIM) CAPACITOR

CROSS-REFERENCE TO RELATED APPLICATIONS

Embodiments of the present invention are related to commonly-assigned U.S. patent application Ser. No. 09/742,918 filed on Dec. 21, 2000 by Ning, entitled "Self-Aligned Double-sided Vertical MIMCap", which is incorporated herein by reference.

TECHNICAL FIELD

Embodiments of the present invention relate generally to the fabrication of semiconductor devices, and more particularly to metal-insulator-metal capacitors (MIMCap's).

BACKGROUND

Semiconductor devices are widely used for integrated circuits for electronic applications, including radios, televisions and personal computing devices, as examples. Such integrated circuits typically include multiple transistors fabricated in single crystal silicon. It is common for there to be millions of semiconductor devices on a single semiconductor product. Many integrated circuits now include multiple levels of metallization for interconnections.

The manufacturing process flow for semiconductors is generally referred to in two time periods: front-end-of-line (FEOL) and back-end-of-line (BEOL). Higher temperature processes are performed in the FEOL, during which impurity implantation, diffusion and formation of active components such as transistors are performed on a semiconductor substrate of a wafer. Lower temperature processes take place in the BEOL, which is generally considered to begin upon the formation of the first metallization layer on the wafer.

Capacitors are elements used extensively in semiconductor devices for storing an electric charge. Capacitors essentially comprise two conductive plates separated by an insulator. The capacitance, or amount of charge held by the capacitor per applied voltage, is measured in farads and depends upon the area of the plates, the distance between them, and the dielectric value of the insulator, as examples. Capacitors are used in filters, in analog-to-digital converters, memory devices, and control applications, and many other types of semiconductor devices.

One type of capacitor is a MIMCap, which is used frequently in mixed signal devices and logic devices, for example. MIMCap's are used to store a charge in a variety of semiconductor devices, such as mixed signal and analog products. MIMCap's typically require a much lower capacitance than deep trench memory capacitors used in dynamic random access memory (DRAM) devices, for example. A MIMCap may have a capacitance requirement of 1 fF/micrometer$^2$, for example.

Recently, there has been an increase in demand for MIMCap's embedded in BEOL integrated circuits. MIMCap's typically are horizontal MIMCap's comprising two metal plates that sandwich a dielectric parallel to the wafer. Prior art horizontal MIMCap's are manufactured in the BEOL by forming the bottom capacitive plate in the first or subsequent horizontal metallization layer of a semiconductor wafer. A capacitor dielectric is deposited over the bottom capacitive plate, and a second mask, pattern and etch step is required to form the top capacitive plate. Alternatively, MIMCap's are formed between horizontal metallization layers in the BEOL in additional horizontal layers, with each plate requiring a separate pattern and etch level.

A horizontal MIMCap requires a large amount of surface area on a semiconductor wafer. A horizontal MIMCap is a large flat capacitor positioned parallel to the wafer surface covering a large area of the chip, and does not provide a high area efficiency. As the demand for the capacitance increases, it is desirable to develop MIMCap's that utilize the chip area as efficiently as possible.

A vertical MIMCap, described in U.S. patent application Ser. No. 09/742,918 for "Self-Aligned Double-sided Vertical MIMCap", is incorporated herein by reference, discloses a vertical MIMCap structure and method that improves the efficiency of the use of chip surface area.

What is needed in the art is a method of fabricating a MIMCap that utilizes wafer area more efficiently and minimizes process complexity than prior art MIMCap's processes.

SUMMARY OF THE INVENTION

Embodiments of the present invention include methods of fabricating high area efficiency MIMCap's embedded in damascene BEOL processes with minimum process complexity added to the commonly-practiced BEOL processes. The method includes fabricating a MIMCap having plates with both vertical and horizontal capacitive regions in a process requiring only one mask and lithography step.

Disclosed is a method of fabricating a MIMCap, comprising providing a wafer having a workpiece, depositing a first insulating layer over the wafer workpiece, and forming a plurality of first conductive lines within the first insulating layer, where the first conductive lines comprising a first conductive material. The method includes depositing a second insulating layer, depositing a resist over the second insulating layer, patterning the resist with a predetermined pattern, and removing portions of the resist to expose portions of the second insulating layer. At least the exposed second insulating layer and portions of the first insulating layer are removed, leaving portions of the first conductive lines exposed. The remaining resist is removed, and a capacitor dielectric is deposited over the first conductive lines. A second conductive material is deposited over the capacitor dielectric to form second conductive lines.

Also disclosed is a method of fabricating a vertical/horizontal MIMCap, comprising providing a wafer having a workpiece, depositing a first insulating layer over the wafer workpiece, forming a plurality of trenches within the first insulating layer, and filling the trenches with a first conductive material to form first conductive lines within the first insulating layer. A cap layer is deposited over the first conductive lines and first insulating layer, a second insulating layer is deposited over the cap layer, and a resist is deposited over the second insulating layer. The method includes patterning the resist with a predetermined pattern defining a MIMCap, removing portions of the resist to expose portions of the second insulating layer, removing the exposed second insulating layer, the cap layer, and portions of the first insulating layer, leaving portions of the first conductive lines exposed, and removing the remaining resist. A capacitor dielectric is deposited over the first conductive lines, and a second conductive material is deposited over the capacitor dielectric to form second conductive lines. Portions of the first conductive lines are coupled together, and portions of the second conductive lines are coupled together, wherein the first and second conductive line portions comprise the plates of a MIMCap, the MIMCap plates having horizontal and vertical portions.

Advantages of the invention include providing a method of fabricating a vertical/horizontal MIMCap that utilizes wafer area more efficiently than prior art horizontal MIM-Cap's. The vertical/horizontal MIMCap described herein may be five times smaller, for example, than horizontal MIMCap's producing the same capacitance. Only one additional mask level is required to implement embodiments of the method. Forming the first conductive lines in the first insulating layer using a damascene process results in a more accurate transfer of the pattern for the conductive lines. The formation of the second conductive lines is self-aligned, being formed between the first conductive lines, and thus, do not require a separate etch process step.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Figure 1:
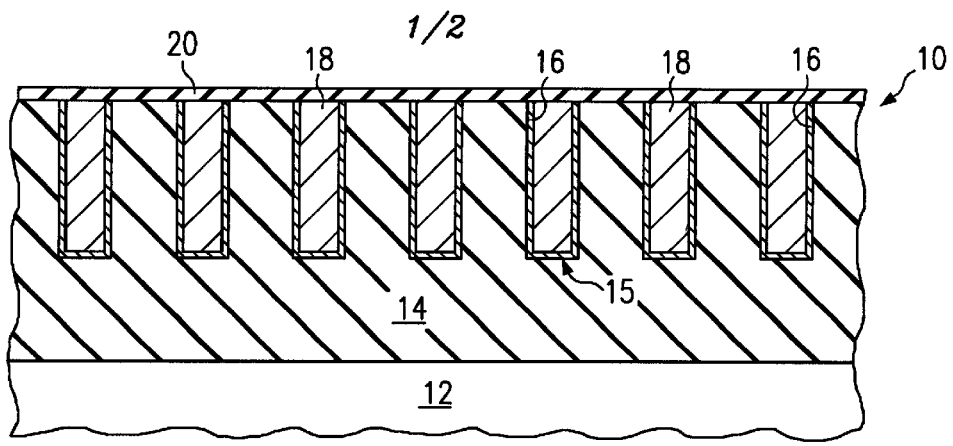
FIGS. 1 through 4 illustrate cross-sectional views of an embodiment of the present invention in various stages of fabrication.

Preferred embodiments of the present invention will be described, followed by a discussion of some advantages of fabricating a vertical/horizontal MIMCap in accordance with embodiments of the invention.

FIGS. 1–4 show cross-sectional views of an embodiment of the present invention in various stages of fabrication. A semiconductor wafer 10 includes a workpiece 12, shown in FIG. 1, which may include a semiconductor substrate comprising silicon or other semiconductor materials covered by an insulating layer, for example. Workpiece 12 may also include other active components or circuits formed in the FEOL, not shown. Workpiece 12 may comprise silicon oxide over single-crystal silicon, for example. The workpiece 12 may include other conductive layers or other semiconductor elements, e.g. transistors, diodes, etc. Compound semiconductors such as GaAs, InP, Si/Ge, SiC, as examples, may be used in place of silicon.

A first insulating layer 14 is deposited over the workpiece 12. The insulating layer 14 preferably comprises an inter-level dielectric (ILD) layer, e.g., the wafer second inter-level dielectric, that conductive leads in a metallization layer may also be formed within elsewhere on the wafer 10, not shown. The first insulating layer 14 preferably comprises silicon dioxide ($SiO_2$) and may alternatively comprise other dielectric materials such as low dielectric constant materials or high dielectric constant materials, for example.

The first insulating layer 14 is patterned, etched, and filled with a conductive material to form first conductive lines 15, preferably in a damascene process. The pattern and fill process may comprise a single damascene or dual-damascene process, for example. The first insulating layer 14 may be lithographically patterned and reactive ion etched (RIE) to form trenches where first conductive lines 15 will be formed. The trenches may be 0.2 $\mu$m wide and 0.4 to 0.6 $\mu$m deep, as examples.

Depending on the conductive material used, conductive lines 15 may include a liner 16. For example, if first conductive lines 15 comprise copper, preferably, liner 16 comprises a copper liner deposited over the wafer surface within the trenches, including along the trench sidewalls, and liner 16 also preferably includes a seed layer formed over the copper liner, adapted to improved the deposition of first conductive material 18. First conductive material 18, comprising copper in this embodiment, is then deposited over the wafer 10 and within the trenches. First conductive lines 15 may comprise minimum (e.g., having the smallest feature size) or larger pitched lines. The wafer 10 is chemically-mechanically polished (CMP'd) to remove the excessive material 16/18 above the top surface of the first insulating layer 14.

First conductive lines 15 comprise a first conductive material 18 preferably comprising a metal such as copper, and alternatively comprising other conductive materials such as Al, TiN, Ti, W, combinations thereof, or other conductive materials, deposited by physical vapor deposition (PVD) or chemical vapor deposition (CVD), as examples. First conductive lines 15 may be part of an M1 or M2 metallization layer, for example.

The depth of first conductive lines 15 may be the same as other metallization lines of the wafer 10, or the depth of first conductive lines 15 may be the total thickness of a via and wiring line, for example, the total thickness of the first insulating layer 14. First conductive lines 15 are preferably spaced apart by a sufficient distance to allow the formation of second conductive lines 28 (of FIG. 4) that will be formed in subsequent steps, to be described further herein.

An optional thin dielectric cap layer 20 may be deposited over insulating layer 14 and first conductive lines 15. The cap layer 20 preferably comprises a thin layer of protective material adapted to prevent diffusion of the metal used for first conductive lines 15 into subsequently deposited insulating layers such as second insulating layer 22. For example, if copper is used for the first conductive lines 15 conductive material, copper has a tendency to diffuse into underlying and overlying dielectrics unless a cap layer 20 is used. Because copper oxidizes easily, when the first conductive lines 15 comprise copper, preferably, cap layer 20 comprises a material other than an oxide, to avoid oxidation of first conductive lines 15. Cap layer 20 may comprise a nitride such as $Si_xN_y$, for example, where x and y are integers of 1 or greater. Also, metal conductive lines within a metallization layer of the semiconductor wafer may be formed simultaneously with the formation of first conductive lines 15, not shown.

Figure 2:
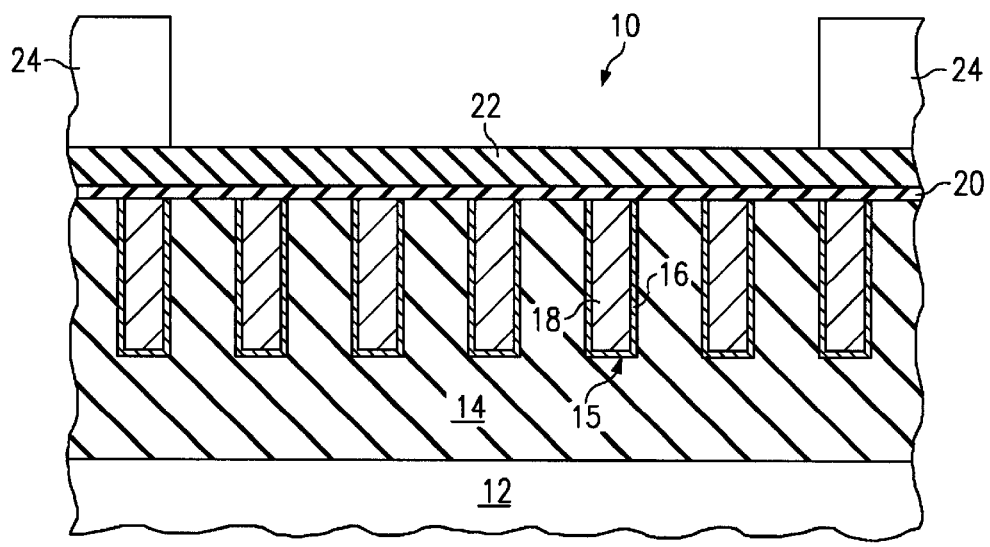

A second insulating layer 22 is then deposited over the cap layer 20, or conductive lines 15 and first insulating layer 14, if no cap layer 20 is used, as shown in FIG. 2. Preferably, the second insulating layer 20 comprises a thin layer of inter-level dielectric, e.g., part of a third inter-level dielectric. The second insulating layer 22 may comprise a thickness ranging, for example, between approximately 15 nm to 200 nm thick. The second insulating layer 22 preferably comprises $SiO_2$ and may alternatively comprise other dielectric materials such as low dielectric constant materials or high dielectric constant materials, for example. The second insulating layer 22 may comprise the same or a different material than first insulating layer 14, for example.

A resist 24 is applied to the wafer 10 to cover the second insulating layer 20. The resist 24 typically comprises an organic polymer, for example. A lithography pattern is formed so that the MIMCap regions are opened and other areas blocked by the resist 24. A lithography mask, not shown, may be used to pattern the resist 24 with a predetermined pattern that defines the shape, size and location for a vertical/horizontal MIMCap. The wafer 10 is exposed, for example, to a UV light, and developed to remove undesired portions of resist 24 using either a positive or negative exposure process, leaving the structure shown in FIG. 2 having resist portions 24 residing over portions of the second insulating layer 22, leaving portions of the second insulating layer exposed.

The wafer 10 is etched to remove at least the exposed portions of second insulating layer 22, cap layer 20, and portions of the first insulating layer 14, leaving portions of the first conductive lines 15 exposed. The etch process to form trenches 130 may comprise, for example, a reactive ion etch (RIE) process. Preferably, trenches are created within first insulating layer 14 that have about the same depth as the height of the first conductive lines 15. Preferably, an RIE etch process is used that is selective to the material used for first conductive lines 15 so that the first conductive lines 15 are substantially unaffected during the etch process. An RIE chemistry, preferably comprising $Cl_2$, $BCl_3$, $N_2$, argon, or a combination thereof may be used, as examples, when aluminum and TiN are used as conductive materials for the first conductive lines 15. Alternatively, an RIE gas 22 such as $SF_6$ may be used when W is used for the conductive material of first conductive lines 15. Alternatively, other RIE gases may be used for the single RIE etch of the present invention, such as HF and others, for example.

Figure 3:
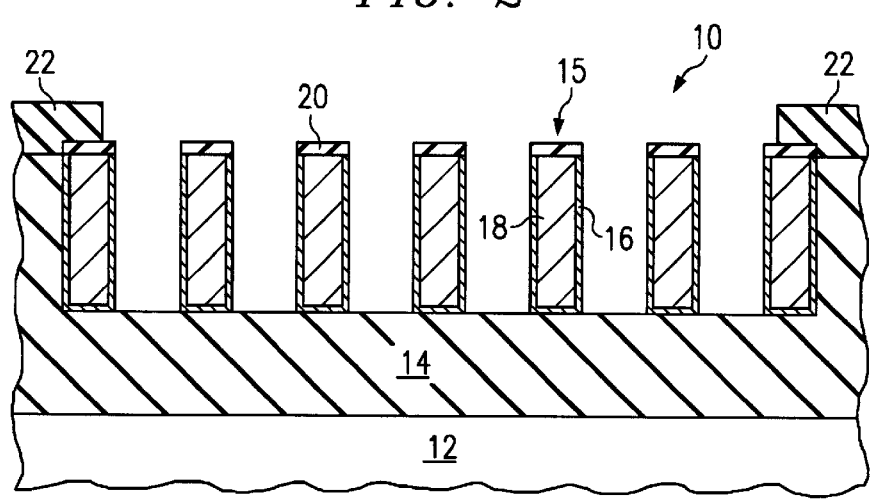

The remaining resist 24 is removed, as shown in FIG. 3, to remove the residual resist 24 (see FIG. 2) on the wafer 10 surface. The first conductive lines 15 remain standing along with trenches within first insulating layer 14, on either side of the conductive lines 15, after the resist strip and removal procedure.

Figure 4:
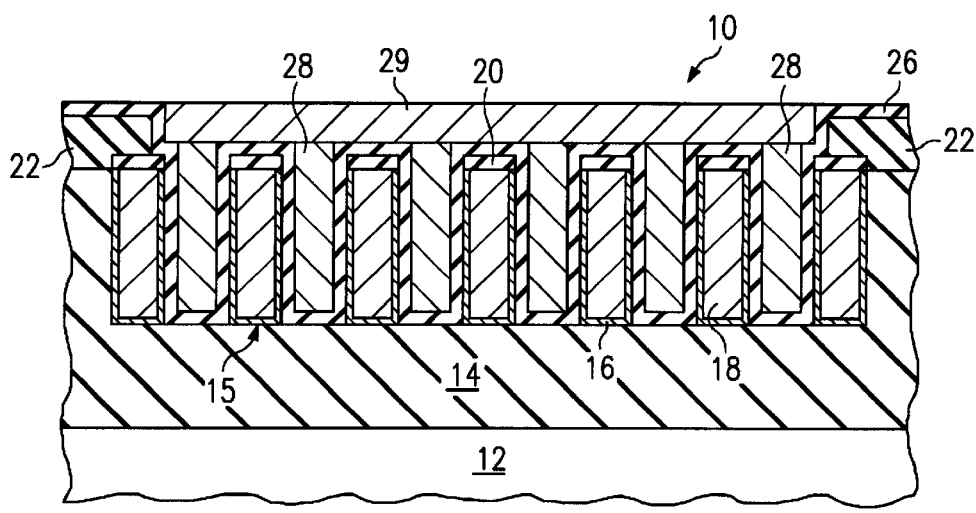

A capacitor dielectric 26 is deposited over the first conductive lines 15, as shown in FIG. 4. The capacitor dielectric 26 preferably comprises a dielectric such as a film containing $Si_xN_y$ or $Ta_2O_5$ deposited by plasma-enhanced chemical vapor deposition (PECVD), for example. Alternatively, capacitor dielectric 26 may comprise other dielectric materials such as SiC, saline oxide, tetraethoxysilane (TEOS), silicon dioxide, silicon nitride, silicon oxynitride, barium strontium titanate (BST) or other insulators, as examples. Preferably, the capacitor dielectric 26 is relatively thin, e.g., 10 nm to 200 nm thick, and is conformal. The capacitor dielectric 26 comprises the capacitor dielectric between the vertical/horizontal MIMCap plates comprised of first conductive lines 15 and second conductive lines 28.

A second conductive material is deposited over the capacitor dielectric 26 to form second conductive lines 28, as shown in FIG. 4. The second conductive material may comprise any conducting material such as a metal, and preferably comprises CVD W or CVD Al. Alternatively, conductive material may comprise TiN, Ti, Ta, TaN, TiW, Cu, Si or various combinations thereof, deposited by PVD (physical vapor deposition), CVD, or plating, as examples. The wafer 10 is subjected to a CMP process to remove excessive second conductive material above the top surface of the second insulating layer 22, with the CMP process preferably adapted to stop at the second insulating layer 22 surface.

Preferably, excess conductive material 29 is left remaining over the second conductive lines 28 so that the second conductive lines 28 are coupled together, to form a top capacitive plate of the MIMCap device 26. Alternatively, excess conductive material 29 may be removed from the surface of the wafer 10, for example, by chemical mechanical polishing (CMP) or other etch process, to leave second conductive lines 28 remaining in trenches 130. The cap layer 126 may serve as an etch or CMP stop layer for the second conductive layer 136 removal. The second conductive lines 28 are then coupled together in subsequent layers, e.g., by an etch run and/or by vias in an upper metallization layers. Alternatively, second conductive lines 28 may be coupled together at the ends of the lines 28 within the same layer as second conductive lines 28.

Figure 5:
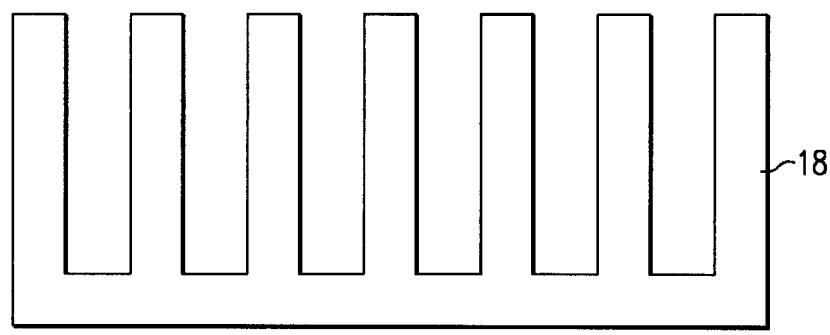
FIG. 5 shows a top view of first conductive lines in an embodiment of the invention.
Figure 6:
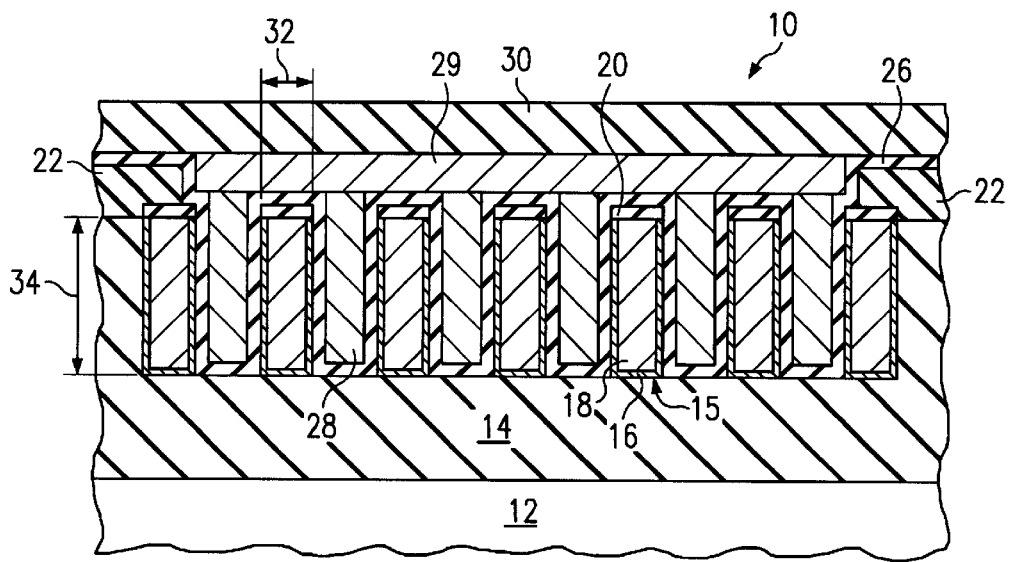
FIG. 6 shows a cross-sectional view of an embodiment of the present invention.

Similarly, first conductive lines 15 are preferably coupled together to form the other, e.g., bottom capacitive plate of the vertical/horizontal MIMCap 36. In one embodiment, first conductive lines 15 are coupled together at the ends of the lines 15 within the same metallization layer as second conductive lines 15, as shown in a top view of a wafer 10 in FIG. 5. In an alternative embodiment, first conductive lines 15 are coupled together by a portion 30 of a metallization layer adjacent to conductive lines 15, e.g., metallization layer 1 (M1), as shown in FIG. 6. In this alternative approach, a metal plate 30 or etch line is disposed below the MIMCap 36 region, increasing the capacitor area and thus increasing the capacitance of the MIMCap 36. Advantageously, this results in a high packing density vertical/horizontal MIMCap that is built-in and embedded in the same level as a BEOL wiring level.

Plates or etch lines 29 and 30 may be coupled to pads on an external surface of the wafer 10, not shown, for example, or coupled to other etch lines, also not shown. Such pads may be electrically coupled to subsequently or previously-deposited metal layers by vias above or below the pads, for example.

A third insulating layer 30 may be deposited over the second insulating layer 22, as shown in FIG. 6. In one embodiment, the total thickness of the second and third insulating layers 22/30 is adapted to be the desired thickness of one single inter-level dielectric layer.

The plurality of first 15 and second 28 conductive lines coupled together forms a vertical/horizontal MIMCap 36 having a comb-to-comb type of structure, with the first conductive lines 15 shaped like a comb and the second conductive lines 28 shaped like a comb, and the two comb faces are interlocked. The first conductive lines 15 coupled together function as a bottom capacitive plate, and the second conductive lines 28 coupled together function as a top capacitive plate. The capacitor dielectric 20 is disposed between the two plates along the entire surface of the top, bottom and sides of the conductive lines 15/28. The MIMCap 36 includes horizontal capacitive regions 32 and vertical capacitive regions 34, shown in FIG. 36. Because more surface area is achieved along the capacitive plates due to the vertical/horizontal MIMCap 36 comb-to-comb structure, a higher capacitance for a MIMCap 36 is achieved in accordance with embodiments of the invention. For example, MIMCap's having a capacitance of approximately 0.2 to 0.5 $fF/cm_2$ may be achieved in accordance with embodiments of the present invention.

Embodiments of the invention have been described herein with resist 24 comprising a positive resist. Alternatively, resist 24 may comprise a negative resist 24, for example. Furthermore, although one vertical/horizontal MIMCap 36 is shown in FIGS. 1 through 4 and 6, a plurality of other MIMCap's 36 may be formed within a single insulating layer 122.

While cross-sectional views of the present vertical MIMCap are shown in FIGS. 1 through 4 and FIG. 6, the MIMCap conductive lines 15/28 are preferably square or rectangular, and may run lengthwise along the semiconductor wafer 10 by a distance (not shown) according to the capacitance desired. Alternatively, rather than being parallel, the first and second conductive lines 15/28 may form other shapes such as U-shape, circles or zig-zags, for example.

Embodiments of the present invention provide several advantages over prior art processes for fabricating MIMCap's. Disclosed herein is a method of making high area efficiency MIMCap's embedded in damascene BEOL processes with minimum process complexity added to common BEOL processes. A minimum-pitched line array is utilized to fabricate MIMCap's having both vertical 34 and horizontal 32 capacitive regions, resulting in an MIMCap 36 with a high packing density. Embodiments described herein comprise simplified processes requiring only one photomask level with relaxed resolution and overlay requirements. Embodiments of the invention connect parallel flat plate capacitors 32 with an array of vertical capacitors 34, without increasing chip area. Only one additional mask level is required to implement embodiments of the method. Forming the first conductive lines 15 in the first insulating layer 14 using a damascene process results in a more accurate transfer of the pattern for the first conductive lines 15. The formation of the second conductive lines 28 is self-aligned, the second conductive lines 28 being formed between the first conductive lines 15, and thus, a separate etch process step is not required for the second conductive lines 28.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a metal-insulator-metal capacitor (MIMCap), comprising:
    providing a wafer having a workpiece;
    depositing a first insulating layer over the workpiece;
    forming a plurality of first conductive lines within the first insulating layer, the first conductive lines comprising a first conductive material;
    depositing a second insulating layer;
    depositing a resist over the second insulating layer;
    patterning the resist with a predetermined pattern;
    removing portions of the resist to expose portions of the second insulating layer;
    removing at least the exposed second insulating layer and portions of the first insulating layer, leaving portions of the first conductive lines exposed;
    removing the remaining resist;
    depositing a capacitor dielectric over the first conductive lines; and
    depositing a second conductive material over the capacitor dielectric to form second conductive lines.

2. The method according to claim 1 wherein portions of the first conductive lines, capacitor dielectric and the second conductive lines form a MIMCap, and wherein portions of the first and second conductive lines comprise plates of the MIMCap, the MIMCap plates having horizontal and vertical portions.

3. The method according to claim 2, further comprising:
    coupling together portions of the first conductive lines; and
    coupling together portions of the second conductive lines.

4. The method according to claim 2 further comprising:
    simultaneously forming interconnect lines in a metallization layer, when forming the first conductive lines of the MIMCap.

5. The method according to claim 1 further comprising:
    depositing a cap layer over the first insulating layer and the first conductive lines; and
    removing portions of the cap layer when removing the exposed second and first insulating layers.

6. The method according to claim 5, wherein depositing a cap layer comprises depositing silicon nitride.

7. The method according to claim 1, wherein removing the exposed first and second insulating layers comprises a reactive ion etch (RIE) process.

8. The method according to claim 7, wherein the RIE comprises an etch process selective to the first conductive line material.

9. The method according to claim 1, wherein forming a plurality of first conductive lines within the first insulating layer comprises a dual or single damascene process.

10. The method according to claim 9, wherein the first conductive material comprises copper.

11. The method according to claim 10, wherein forming the first conductive lines comprises:
    forming a plurality of trenches within the first insulating layer, the first insulating layer having a top surface;
    depositing a copper liner the first insulating layer and within the trenches;
    forming a copper seed layer over the copper liner;
    filling the trenches with the first conductive material; and
    chemically-mechanically polishing the wafer to remove the copper liner, copper seed layer, and conductive material from the first insulating layer top surface.

12. The method according to claim 1 wherein forming the second conductive lines comprises forming tungsten lines.

13. The method according to claim 1 wherein forming the first and second insulating layers comprise forming inter-level dielectric layers.

14. The method according to claim 1, further comprising depositing a third insulating layer over the second insulating layer and the second conductive lines.

15. The method according to claim 1, wherein depositing the capacitor dielectric comprises depositing silicon nitride.

16. A method of fabricating a vertical/horizontal metal-insulator-metal capacitor (MIMCap), comprising:
    providing a wafer having a workpiece;
    depositing a first insulating layer over the workpiece;
    forming a plurality of trenches within the first insulating layer;
    filling the trenches with a first conductive material to form first conductive lines within the first insulating layer;

depositing a cap layer over the first conductive lines and first insulating layer;

depositing a second insulating layer over the cap layer;

depositing a resist over the second insulating layer;

patterning the resist with a predetermined pattern defining a MIMCap;

removing portions of the resist to expose portions of the second insulating layer;

removing the exposed second insulating layer, the cap layer, and portions of the first insulating layer, leaving portions of the first conductive lines exposed;

removing the remaining resist;

depositing a capacitor dielectric over the first conductive lines;

depositing a second conductive material over the capacitor dielectric to form second conductive lines;

coupling together portions of the first conductive lines; and coupling together portions of the second conductive lines, wherein portions of the first and second conductive lines comprise the plates of a MIMCap, the MIMCap plates having horizontal and vertical portions.

17. The method according to claim 16, further comprising, after forming the trenches within the first insulating layer:

depositing a metal liner over the first insulating layer and within the trenches; and forming a seed layer over the metal liner.

18. The method according to claim 17, further comprising, after filling the trenches with a first conductive material:

chemically-mechanically polishing the wafer to remove the metal liner, seed layer, and first conductive material from the first insulating layer top surface.

19. The method according to claim 18 wherein depositing a metal liner comprises depositing a copper liner; wherein forming a seed layer comprises forming a copper seed layer; wherein filling the first insulating material trenches comprises filling the trenches with a material comprising copper; and wherein forming the second conductive lines comprises forming tungsten lines.

20. The method according to claim 16, wherein removing the exposed first and second insulating layers and cap layer comprises a reactive ion etch (RIE) process.

21. The method according to claim 16 wherein forming the first and second insulating layers comprise forming inter-level dielectric layers.

22. The method according to claim 21, further comprising depositing a third insulating layer over the second insulating layer and the second conductive lines.

* * * * *

UNITED STATES PATENT AND TRADEMARK OFFICE
CERTIFICATE OF CORRECTION

PATENT NO. : 6,620,701 B2
DATED : September 16, 2003
INVENTOR(S) : Ning

It is certified that error appears in the above-identified patent and that said Letters Patent is hereby corrected as shown below:

Title page,
Item [57], ABSTRACT,
Lines 2 and 6, delete "(36)".

Column 2,
Line 30, replace "comprising" with -- comprise --.

Column 5,
Line 17, delete "130"; and
Line 58, replace "conductive material" with -- the second conductive material --.

Column 6,
Line 6, delete "130";
Line 7, delete "126";
Line 8, delete "136";
Line 10, replace "layers" with -- layer --;
Lines 16, 25, 26, 42 and 52, delete "36";
Line 53, replace "FIG. 36" with -- FIG. 6 --;
Lines 55, 56, 64 and 66, delete "36"; and
Line 67, replace "layer 122" with -- layer 22 --.

Column 7,
Line 16, delete "36".

Column 8,
Line 42, replace "copper liner the" with -- copper liner over the --.

Signed and Sealed this

Second Day of March, 2004

JON W. DUDAS
*Acting Director of the United States Patent and Trademark Office*